United States Patent

[11] 3,602,829

[72] Inventor Gerald R. Mansfield
Raleigh, N.C.
[21] Appl. No. 3,402
[22] Filed Jan. 16, 1970
[45] Patented Aug. 31, 1971
[73] Assignee The United States of America as represented by the Secretary of the Army

[54] HIGH GAIN AMPLIFIER AND FEEDBACK ARRANGEMENT FOR CURRENT DRIVING A SINGLE COIL
7 Claims, 2 Drawing Figs.

[52] U.S. Cl. .......... 330/3, 330/14, 330/20, 307/262, 330/24
[51] Int. Cl. .......... H03f 5/00, H05f 21/00
[50] Field of Search .......... 330/146, 3, 24; 307/262, 236, 254, 255

[56] References Cited

UNITED STATES PATENTS

| | | | |
|---|---|---|---|
| 3,078,379 | 2/1963 | Plogstedt et al. .......... | 307/254 |
| 3,120,615 | 2/1964 | Sheehan .......... | 307/262 |

*Primary Examiner*—Nathan Kaufman
*Attorneys*—Harry M. Saragovitz, Edward J. Kelly, Herbert Berl and Harold W. Hilton

ABSTRACT: A high gain amplifier and feedback arrangement utilizing a class B power stage for current driving a single coil wherein the precession coil of a spinning magnet gyroscope is controlled by sending a precise current through the coil. A first operational amplifier with differential input terminals generates either a positive or negative output. A positive output drives one side of the class B output stage to control current flow in one direction through the load. A negative output drives the other side of the class B output stage by way of a second operational amplifier connected as an inverter to control current in the inverse direction through the load. The load current is arranged to provide feedback to the first operational amplifier so that the load current is a replica of the input for both directions of current flow in the load. An output stage switching transistor is conducting or cut off when the corresponding class B stage side conducts or is cut off. The two output stage switching transistors are controlled from a switching differential pair of transistors which in turn is controlled by the output of the first operational amplifier. Switching of all switching transistors and circuits occurs when the input signal passes through zero at which time the load current is zero.

Gerald R. Mansfield,
INVENTOR.
BY Harry M. Saragovitz
Edward J. Kelly
Herbert Berl
Harold W. Hilton

HIGH GAIN AMPLIFIER AND FEEDBACK ARRANGEMENT FOR CURRENT DRIVING A SINGLE COIL

SUMMARY OF THE INVENTION

The apparatus of the present invention is an electrical circuit for supplying and controlling the precise amount of current supplied to a load. A precisely controlled current is injected through a load coil irrespective of any electromotive force that may exist in the load.

A first operational amplifier having a differential input is used to control the current in the load. Current through the load is arranged to provide a feedback signal to one side or the other of the first operational amplifier input according to the direction of the load current. This feedback ensures that the load current is a replica of the input signal. A second operational amplifier, employed as a sense-reversing amplifier, and a switching circuit assist in driving the output stage. The output stage requires only one supply potential and operates in the class B mode.

An object of the present invention is to prevent current flow due to induced electromotive force in the precession coil of spinning magnet gyroscope.

Another object of the present invention is to inject an alternating current in a single precession coil. A single coil used for alternating current as compared with a center tapped coil with each half driven by half wave current will result in reduced coil dissipation for the same coil volume and magnetic effect.

Yet another object of the present invention is to operate the output amplifier stage in the class B mode and to employ only one B+ (or B−) supply for the output stage.

DESCRIPTION OF THE PREFERRED EMBODIMENT

Figures 1, 2:
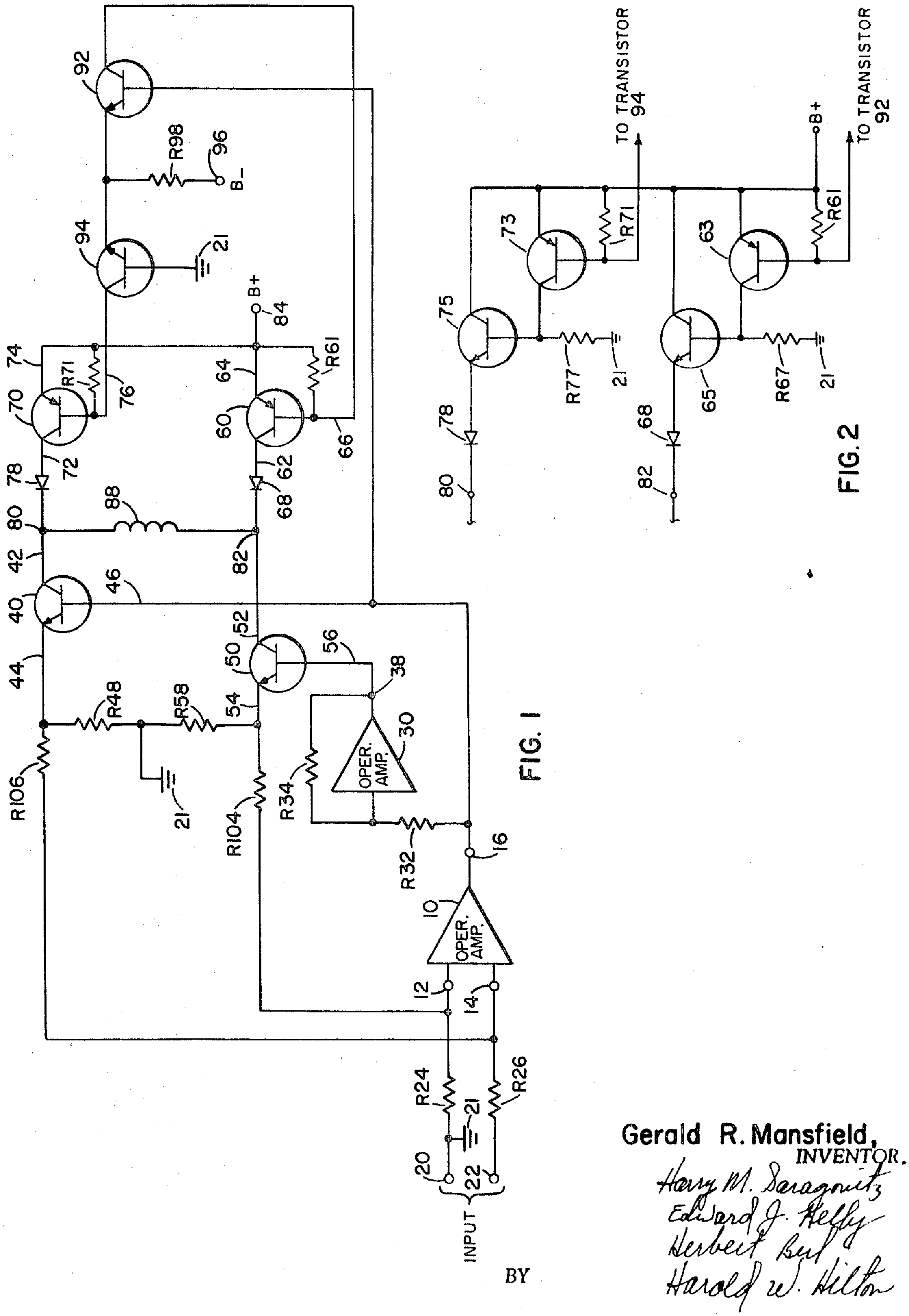
FIG. 1 is a circuit diagram of the amplifier and feedback arrangement used with a load coil.
FIG. 2 is an alternate embodiment for supplying load current to the coil.

Referring to the drawings, like numerals represent like parts in each figure. FIG. 1 discloses a preferred embodiment of the present invention. An operational amplifier 10 having a differential input, has a pair of input terminals 12 and 14 and an output terminal 16. When the potential of terminal 12 is slightly more positive than the potential of terminal 14 the potential of the output terminal 16 is positive to ground. Thus terminal 14 is the inverting input terminal and terminal 12 is the noninverting or direct input terminal. The input signal is applied at a terminal 22. A terminal 20 is grounded and connects to input terminal 12 via a resistor R24. When the input signal at terminal 22 is negative with respect to grounded terminal 20, terminal 12 is at ground potential, terminal 14 is negative with respect to ground, and output terminal 16 is positive. Similarly, when terminal 22 is positive with respect to ground, terminal 14 is positive and output terminal 16 is negative to ground. Therefore, with terminal 20 grounded, terminal 22 provides a single-ended input for amplifier 10. The single-ended input signal is applied to amplifier 10 at terminal 14 via a resistor R26 and is combined within the amplifier with other signals to amplifier 10 received via resistors R106, R104, and R24. A second operational amplifier 30 in combination with an input resistor R32 and a feedback resistor R34 forms an inverting amplifier. Thus the potential of an output terminal 38 of amplifier 30 is of opposite sense to and proportional to the potential of output terminal 16. Output terminal 16 of amplifier 10 is connected through R32 to operational amplifier 30.

Transistors 40, 50, 60, and 70 form a bridge circuit with a transistor in each arm of the bridge. This bridge is the output stage of the amplifier which drives a load 88. The collector 72 of transistor 70 is connected through a diode 78 to a load terminal 80 which is also connected to collector 42 of transistor 40. The emitter 44 of transistor 40 is connected through a resistance R48 to ground 21 and through R106 to terminal 14. The collector 62 of transistor 60 is connected through a diode 68 to a load terminal 82 which is also connected to collector 52 of transistor 50. The emitter 54 of transistor 50 is connected through a resistor R58 to ground 21 and through R104 to terminal 12. In operation, either transistors 70 and 50 or transistors 60 and 40 are conducting. With the polarity transistors and diodes shown in FIG. 1 conventional current flowing in load 88 from terminal 80 to terminal 82 requires transistors 70 and 50 to conduct. This load current flows through R58 to ground causing a positive potential developed at emitter 54 to be proportional to the load current. The potential developed at emitter 54 is used to provide feedback through R104 to operational amplifier 10. Conventional current flowing in the load from terminal 82 to 80 requires transistors 60 and 40 to conduct. This load current flows through R48 to ground causing a positive potential developed at emitter 44 to be proportional to the load current. This positive potential is used to provide feedback through R106 to operational amplifier 10. Load current is supplied from a B+ terminal 84 to emitter 74 or emitter 64 of transistors 70 or 60, respectively, according to the direction of current flow in load 88. A resistor R71 connects the base to the emitter of transistor 70 so that in the absence of a current applied to base terminal 76 transistor 70 is nonconducting. Similarly, a resistor R61 will cause transistor 60 to be nonconducting in the absence of an applied current at base terminal 66. Thus, when the appropriate transistors are conducting, a power source supplies power between B+ terminal 84 and ground through the power stage transistors to load 88.

Transistors 92 and 94 act as a switching circuit for directing the flow of current through load 88. The emitters of transistors 92 and 94 are connected through a resistance R98 to a power source by way of B− terminal 96. The collector of transistor 92 is connected to base 66 of transistor 60 and the collector of transistor 94 is connected to base 76 of transistor 70. The base of transistor 92 is connected to output terminal 16 of operational amplifier 10 and to base 46 of transistor 40. The base of transistor 94 is connected to ground 21. Base 56 of transistor 50 is connected to output 38 of amplifier 30. These connections and appropriate proportioning of the resistors and choice of transistor types cause transistors 92 and 94 to direct current from terminal 96 entirely through transistor 92 when output terminal 16 is sufficiently positive to cause perceptible conduction in transistor 40. The current through transistor 92 is applied to the base of transistor 60 so that this transistor will pass a large collector current with only a small potential drop from emitter 64 to collector 62. When terminal 16 is positive, the current in load 88 is controlled by transistor 40 which in turn is included in a feedback amplifier loop containing operational amplifier 10. The differential transistor pair 92 and 94 causes transistor 60 to conduct and operate in the saturated state while transistor 70 is rendered nonconducting. Operational amplifier 30 causes transistor 50 to be cut off due to the negative potential on its base 56. When transistor 50 is cut off its emitter 54 and the input terminal 12 of operational amplifier 10 acquire ground potential.

When terminal 16 is negative, load current is controlled by transistor 50 via operational amplifier 30 and the feedback loop containing amplifier 10. Transistor 40 is nonconductive, when terminal 16 is negative, transistor 70 is saturated due to the current through R98 passing through transistor 94 to the base terminal 76, and transistor 60 is cut off. When transistor 70 is saturated the potential of collector 72 closely approaches the supply potential of terminal 84. The potential of load terminal 80 differs from the potential of collector 72 by the potential drop across diode 78, normally a few tenths of 1 volt. Thus any induced potential in the load, due to any reason, manifests itself as a potential on terminal 82. This may be positive or negative relative to the potential of terminal 80. If this induced potential is positive relative to the potential of terminal 80, the diode 68 prevents collector-to-base conduction of transistor 60. The feedback control of operational amplifier 10 and the high collector impedance of transistor 50 prevent the induced potential from having any effect on the load current. When the induced potential in the load causes the potential of terminal 82 to be less positive than the potential of terminal 80, conduction in transistor 60 is prevented by the circuit conditions which result in transistors 50 and 70 conducting and transistor 60 being cut off. The high collector impedance of transistor 50 and the feedback loop through R104 controlling the current in transistor 50 prevent the potential of terminal 82 from having any effect on the current passed by transistor 50. Similarly, when terminal 16 is positive and transistors 40 and 60 are conducting, the potential of terminal 82 is slightly less positive than the potential of terminal 84, B+. An induced potential difference across the load cannot cause current flow through load 88 due to the presence of diode 78 and due to the control of current through transistor 40 by the action of the feedback loop containing transistor 40, R106 and operational amplifier 10.

From the preceding description it will be appreciated that operational amplifier 10, phase inverting amplifier 30 and transistors 40 and 50 form a Class B amplifier with zero quiescent current at zero input to terminal 22. The differential pair 92 and 94 together with transistors 60 and 70 permit a single coil rather than the usual center tapped load to be driven by the Class B amplifier. It will also be appreciated that the amplifier is DC coupled so that the amplifier will operate satisfactorily with arbitrary waveforms.

An ideal operational amplifier requires no current and virtually no potential difference at the input terminals to cause the output to reach either positive or negative saturation. Thus the feedback amplifier can be approximately analyzed by assuming that the potential difference between terminals 12 and 14 is kept zero at all times due to the feedback action. When the potential on terminal 22, $E_{22}$, is negative, terminal 12 is at ground potential as described previously, and emitter 44 is positive with respect to terminal 14 by an amount $-E_{22} \times R106/R26$. The approximate current flowing from terminal 82 to terminal 80 in load 88 is $-E_{22} \times R106/R26 \times 1/R48$. The approximation assumes that the load current through 106 to ground potential (terminal 14 is at ground potential) is negligible compared to the load current through 48. When terminal 22 is positive, transistor 40 is nonconducting and the approximate potential of terminal 14 is $E_{22} \times R106/(R\ 106 + R26)$ . The potential of terminal 12 must follow the potential of terminal 14 so that the approximate potential of emitter 54 is $E_{22} \times R106/(R106 \times R26) \times (R104 \times R24)/R24$. The load current flowing from terminal 80 to terminal 82 is approximately $E_{22} \times R106/(R106 + R26) \times R104 + R24)/R24 \times 1/R58$. Typically R48 and R58 are equal and low in value and it is desired to make the load current a faithful copy of the input potential. For this condition $R106/R26 = R106/(R106 + R26) \times R104 + R24)/R24$ from which it may be seen that $R106/R26 = R104/R24$. Those skilled in the art may refine the preceding approximate analysis or modify the design to suit other requirements.

Although all components in the amplifier must be considered to determine dynamic range, generally, the output stage design and B+ supply potential determines the large signal limits of the dynamic range and the operational amplifier and feedback arrangements together with the switching transistor circuit determines the small signal limits of the dynamic range.

When the input potential of terminal 22 passes through zero, switching is required between transistors 40 and 50 and between transistors 60 and 70. By use of a high gain operational amplifier 10 the transition region may be reduced to a very small magnitude potential. The switching potential region of transistors 92 and 94 is smaller than the switching region for transistors 40 and 50.

Although a particular embodiment and form of this invention has been illustrated, it is obvious to those skilled in the art that considerable variation in detail may be considered. For instance, the differential switching pair transistors 92 and 94) may be arranged to gradually increase the current capability of transistors 60 and 70 as the current through transistors 40 and 50 is increased in order to help reduce transients. The base of transistor 94 may be driven from the output of operational amplifier 30 instead of being grounded as shown in FIG. 1. The bridge transistors may be multiple transistors to increase current capability or gain or both. High gain is desirable for transistors 40 and 50 for some applications where a highly precise relation between load current and input potential is required. Bias currents may be applied to emitters 44 and 54 to help in reducing any switching transients. Transistors 60 and 70 may also take the form of a low-power PNP driving stage with an NPN power stage.

FIG. 2 shows transistor 70 replaced with a low-power PNP transistor 73 and a power NPN transistor 75. A resistor R77 connected between ground and the base of transistor 75 serves to cut off transistor 75 when no drive is applied from transistor 94 to transistor 73. Transistor 60 is replaced with a low-power PNP transistor 63 and a power NPN transistor 65. A resistor R67 serves to cut off transistor 65 when no drive is applied from transistor 92 to transistor 63. All other components perform the same or similar functions as previously explained. It is possible to choose transistors of opposite polarity for the output and switching circuit and operate the power stage from a B—0 power supply. It will be appreciated that most of the power needed to operate the amplifier in typical applications will be required by the output stage and that this power supply (terminal 84) need not be well regulated or smoothed.

I Claim:

1. A single ended input high gain amplifier and feedback circuit comprising: a differential means having an output and first and second inputs for receiving and acting on an input signal to provide an output signal, said differential means being an operational amplifier having a negative output for a positive input and a positive output for a negative input; switching means having first and second outputs and a signal input connected to said differential means output; phase-inverting means having an output and an input that is connected to said differential means output; a reversible load; a power source for said load; bridge means consisting of four branches wherein a first pair of diagonally opposite corners is connected to said load and a second pair of diagonally opposite corners is connected to said power supply for controllably reversing said power source across the load in response to said differential means input, said bridge having first, second, third, and fourth branches and first, second, third, and fourth transistors in respective branches, the base of said first transistor being responsive to said differential means output to activate said first transistor, the base of said second transistor being responsive to said phase-inverting means output for activation thereof, the base of said third and fourth transistors being responsive to said switching means output for activation thereof, one side of said load being connected to the bridge at a junction between said first and fourth branches, and the other side of said load being connected at a junction between said second and third branches.

2. An amplifier and feedback circuit as set forth in claim 1 wherein said phase-inverting means is an operational amplifier functioning as an inverter to produce a positive output when receiving a negative input, and a negative output when receiving a positive input.

3. An amplifier and feedback circuit as set forth in claim 2 wherein said switching means comprise fifth and sixth transistors having common emitters connected through a resistance to a power source, the base of said sixth transistor being common with a system ground and the base of said fifth transistor being connected in common with the base of said first transistor for response to the output of said differential means, the collector of said fifth transistor being connected to the base of said third transistor for activation thereof in response to a positive output from said differential means, and the collector of said sixth transistor being connected to the base of said fourth transistor for activation thereof in response to a negative output from said differential means.

4. The amplifier and feedback circuit as set forth in claim 3 wherein the emitters of said third and fourth transistors are connected to a power source, the emitters of said first and second transistors are connected through a matched pair of resistors to a circuit ground and through an additional pair of resistors for providing feedback to the differential means input, the emitter of said second transistor being connected to the noninverting second input of said differential means, and the emitter of said first transistor being connected to the inverting first input of said differential means.

5. The amplifier and feedback circuit as set forth in claim 4 further comprising a first diode connected between the load and said third transistor; a second diode connected between the load and said fourth transistor; a feedback loop between the output and the input of said phase inverting means, conventional current flows through said third transistor, load, and first transistor when said differential means output is positive and said second and fourth transistors are cut off, and conventional current flows through said fourth transistor, load, and second transistor when said phase inverting means has a positive output and said first and third transistors are cut off.

6. An amplifier and feedback circuit as set forth in claim 3 wherein said switching means comprise fifth and sixth transistors having common emitters connected through a resistance to a power source, the base of said sixth transistor being common with a system ground and the base of said fifth transistor being connected in common with the base of said first transistor for response to the output of said differential means, a first low-power driving transistor connected between the base of said third transistor and the collector of said fifth transistor to activate said third transistor in response to a positive output of said differential means, a second driving transistor connected between the base of said fourth transistor and the collector of said sixth transistor to activate said fourth transistor in response to a negative output of said differential means, the base of said third and said fourth transistors are each connected through a resistance to a system ground; and further comprising a first diode connected between the load and said third transistor a second diode connected between the load and said fourth transistor, said diodes preventing load currents from flowing inversely through said third and fourth transistors, said first transistor is activated by a positive output of said differential means, and said second transistor is activated by a positive output of said phase-inverting means.

7. The amplifier and feedback circuit as set forth in claim 6 wherein the collectors of said third and fourth transistors are connected to a power source, the emitters of said first and second transistors are connected through a matched pair of resistors for providing feedback to the differential means input, the emitter of said second transistor being connected to the noninverting second input of said differential means, and the emitter of said first transistor being connected to the inverting first input of said differential means.